(12) United States Patent
Gai et al.

(10) Patent No.: US 10,014,360 B2
(45) Date of Patent: Jul. 3, 2018

(54) ARRAY SUBSTRATE COMPRISING A POWER WIRE LAYER AND MANUFACTURING METHOD THEREOF

(71) Applicant: BOE TECHNOLOGY GROUP CO., LTD., Beijing (CN)

(72) Inventors: Cuili Gai, Beijing (CN); Zhongyuan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/443,798

(22) PCT Filed: Sep. 4, 2014

(86) PCT No.: PCT/CN2014/085926
§ 371 (c)(1),
(2) Date: May 19, 2015

(87) PCT Pub. No.: WO2015/188472
PCT Pub. Date: Dec. 17, 2015

(65) Prior Publication Data
US 2016/0247874 A1    Aug. 25, 2016

(30) Foreign Application Priority Data

Jun. 13, 2014    (CN) .......................... 2014 1 0266064

(51) Int. Cl.
*H01L 27/32* (2006.01)
*H01L 21/76* (2006.01)
(Continued)

(52) U.S. Cl.
CPC .......... *H01L 27/3279* (2013.01); *H01L 21/77* (2013.01); *H01L 2227/323* (2013.01); *H01L 2924/0002* (2013.01)

(58) Field of Classification Search
CPC ........... H01L 27/3279; H01L 2227/323; H01L 21/768; H01L 21/77; H01L 23/528;
(Continued)

(56) References Cited

U.S. PATENT DOCUMENTS

2006/0147650 A1* 7/2006 Park .................... H01L 27/1214
428/1.1
2007/0077848 A1* 4/2007 Koo .................... H01L 27/3276
445/24
(Continued)

FOREIGN PATENT DOCUMENTS

CN            1430287 A     7/2003
CN            1462900 A    12/2003
(Continued)

OTHER PUBLICATIONS

First Office Action of CN 201410266064.6 and English Translation Thereof dated May 4, 2016.
(Continued)

*Primary Examiner* — Didarul Mazumder
(74) *Attorney, Agent, or Firm* — Nath, Goldberg & Meyer; Joshua B. Goldberg (57) ABSTRACT

The present invention provides an array substrate and a manufacturing method thereof. The array substrate of the present invention comprises multiple pixel units arranged in an array, each pixel unit comprising a substrate, an active layer, a source layer and a drain layer arranged in the same layer, and a gate layer; wherein each pixel unit further comprises a power wire layer connected to the source layer via a via hole. Since the power wire layer of the present invention is separately provided as a layer, the area of the projection of the power wire layer on the substrate may be larger, that is, the conductive cross-sectional area of the power wire layer may be larger, and thus the resistance of the power wire layer is decreased. Therefore, difference among
(Continued)

currents of different pixel units is reduced, and thus the mura phenomenon generated in displaying is alleviated.

8 Claims, 6 Drawing Sheets

(51) Int. Cl.
*H01L 21/77* (2017.01)
*H01L 23/52* (2006.01)
*H01L 29/00* (2006.01)
*H01L 27/12* (2006.01)
*H01L 29/66* (2006.01)
*H01L 29/78* (2006.01)
*G02F 1/13* (2006.01)

(58) Field of Classification Search
CPC ............ H01L 27/32; H01L 2924/0002; H01L 2924/00; H01L 27/1214; H01L 27/12; H01L 29/66757; H01L 29/78621; G02F 1/13454
USPC ..... 257/72; 438/48, 128, 149, 151, 157, 283
See application file for complete search history.

(56) References Cited

U.S. PATENT DOCUMENTS

| | | | |
|---|---|---|---|
| 2009/0207362 A1 | 8/2009 | Nagano et al. | |
| 2013/0082271 A1* | 4/2013 | Kanegae | H01L 27/124 257/72 |

FOREIGN PATENT DOCUMENTS

| | | |
|---|---|---|
| CN | 1782832 A | 6/2006 |
| CN | 101059631 A | 10/2007 |
| CN | 102931197 A | 2/2013 |
| CN | 203983287 U | 12/2014 |

OTHER PUBLICATIONS

Form PCT/ISA/237 issued in International Application No. PCT/CN2014/085926 dated Mar. 17, 2015.
Form PCT/ISA/210 issued in International Application No. PCT/CN2014/085926 dated Jun. 13, 2014.
Second Office Action dated Dec. 21, 2016 in corresponding Chinese Application No. 201410266064.6.

* cited by examiner

ARRAY SUBSTRATE COMPRISING A POWER WIRE LAYER AND MANUFACTURING METHOD THEREOF

This is a National Phase Application filed under 35 U.S.C. 371 as a national stage of PCT/CN2014/085926, filed Sep. 4, 2014, an application claiming the benefit of Chinese Application No. 201410266064.6, filed Jun. 13, 2014, the content of each of which is hereby incorporated by reference in its entirety.

FIELD OF THE INVENTION

The present invention relates to the field of display technology, and particularly to an array substrate and a manufacturing method thereof.

BACKGROUND OF THE INVENTION

Organic light emitting diode (OLED), as a current-driven light emitting device, has been increasingly applied in high-performance display. A conventional passive matrix OLED display requires shorter driving time for a single pixel as the size thereof increases, and thus it is required to increase transient current, which increases power consumption. Meanwhile, application of large current may result in a too large voltage drop on an ITO (indium tin oxide) line and cause the working voltage of the OLED to be too high, thereby reducing the efficiency thereof. While in an active matrix OLED display, currents for OLEDs are input in a progressive scanning way through switch tubes, which can effectively solve these problems.

Figure 1:
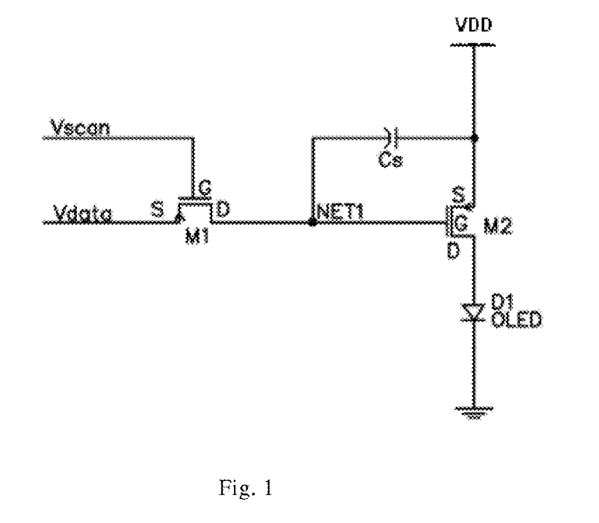
FIG. 1 is a schematic diagram of a conventional 2T1C pixel driving circuit comprising P-type TFTs, in the prior art.

FIG. 1 is a conventional 2T1C pixel driving circuit comprising P-type TFTs. As shown in FIG. 1, the pixel driving circuit comprises: a switch transistor M1 configured to control input of a data line voltage Vdata, a driving transistor M2 configured to control light emitting current of an OLED, and a storage capacitor Cs configured to provide a bias voltage and a maintaining voltage for a gate of the driving transistor M2.

The above 2T1C pixel driving circuit includes, in one frame time, two working phases: a data line voltage Vdata writing phase t1 and a display maintaining phase t2.

In the writing phase t1, the line-scanning line voltage Vscan is at a low level, at this point, the switch transistor M1 is turned on, the data line voltage Vdata is written into the storage capacitor Cs through the channel between a drain and a source of the switch transistor M1 and meanwhile is applied to the gate of the driving transistor M2 (in FIG. 1, G, S and D indicate the gate, the source and the drain, respectively), as a result, the driving transistor M2 is turned on, and the supply voltage VDD drives an OLED to emit light.

In the display maintaining phase t2, the line-scanning line voltage Vscan is at a high level, the switch transistor M1 is in a turn-off state, the channel between the drain and the source thereof is turned off, and therefore, the channel between the data line voltage Vdata and the storage capacitor Cs (the gate of the driving transistor M2) is turned off. At this point, it can be considered as that there is no path for charges on the storage capacitor Cs to discharge since the switch transistor M1 is turned off, and thus the storage capacitor Cs still maintains the state in which the storage capacitor Cs was before the switch transistor M1 is turned off, that is, the voltage across two ends of the storage capacitor Cs maintains unchanged. Therefore, the driving transistor M2 is still on and keeps the OLED emitting light until the line-scanning line voltage Vscan of the next frame cycle arrives and the switch transistor is turned on again.

Here, driving current for the OLED may be represented by the following formula (1):

$$I_{OLED} = \frac{1}{2}\mu_P \cdot C_{ox} \cdot \frac{W}{L} \cdot (Vdata - VDD - V_{TH})^2 \quad (1)$$

wherein, $\mu_P$ is carrier mobility, $C_{OX}$ is capacitance of a gate oxide layer, W/L is width-to-length ratio of the transistor, Vdata is data line voltage, VDD is AMOLED backplane supply voltage and is shared by all pixel units, and $V_{TH}$ is threshold voltage of the transistor. It can be seen that, the driving current for the OLED is related to the backplane supply voltage VDD.

In large-sized display applications, since a backplane power line has a certain resistance, and driving currents for all pixels are provided by the supply voltage VDD, supply voltage at an area closer to the supplying position of the backplane supply voltage VDD is higher than supply voltage at an area away from the supplying position of the backplane supply voltage VDD, that is, a voltage drop occurs. Since the backplane supply voltage VDD is related to the driving current, the voltage drop may result in different currents at different areas, and thus mura occurs in displaying.

In the prior art, in each pixel unit in a pixel area on an array substrate, a power wire layer and a gate layer or a source/drain layer are arranged in the same layer and parallel to each other. In this way, in addition to a portion of a display area of the pixel unit is occupied by the gate or source/drain layer, a relatively large area of the display area of the pixel unit is occupied by the power wire layer, which decreases aperture ratio of the pixel. The power wire layer cannot be formed in a lattice-like structure, which renders the power wire layer with a relatively large resistance. Further, the area occupied by the power wire layer is limited, and the conductive section of the power wire layer is limited, which also renders the power wire layer with a relatively large resistance.

SUMMARY OF THE INVENTION

An object of the present invention is to provide an array substrate and a manufacturing method thereof, which can solve the problem of non-uniform brightness among pixels due to that the resistance of a power wire is relatively large in the prior art, and in which the resistance of the power wire is decreased.

The array substrate provided by the present invention comprises a substrate and a plurality of pixel units arranged in an array, each pixel unit comprising: an active layer, a source layer and a drain layer arranged in the same layer, and a gate layer; wherein each pixel unit further comprises a power wire layer, which is connected to the source layer via a via hole.

Preferably, a projection of the power wire layer on the substrate at least partially overlaps with projections of the gate layer, the source layer and the drain layer on the substrate.

Preferably, the projections of the gate layer, the source layer and the drain layer on the substrate cover the projection of the power wire layer on the substrate. Preferably, the power wire layer is arranged in a lattice-like structure throughout an entire pixel area.

Preferably, the power wire layer is made of copper or a copper alloy.

Preferably, the power wire layer is arranged on the substrate, a first insulating layer is provided on the power wire layer, the gate layer is arranged on the first insulating layer, a second insulating layer is provided on the gate layer, the active layer is arranged on the second insulating layer, and the source layer and the drain layer are arranged on the active layer in the same layer and spaced apart from each other; the source layer is connected to the power wire layer via the via hole positioned in both the first insulating layer and the second insulating layer.

Preferably, the gate layer is arranged on the substrate, a first insulating layer is provided on the gate layer, the active layer is arranged on the first insulating layer, the source layer and the drain layer are arranged on the active layer in the same layer and spaced apart from each other, a second insulating layer is provided on the source layer and the drain layer, the power wire layer is arranged on the second insulating layer, and the power wire layer is connected to the source layer via the via hole positioned in the second insulating layer.

Another object of the present invention is to provide a manufacturing method of the above array substrate, comprising a step of:

forming a power wire layer on a substrate through a patterning process.

Preferably, before or after the step of forming a power wire layer on a substrate through a patterning process, the method further comprises steps of:

forming a source layer on the substrate through a patterning process; and forming a via hole between the power line layer and the source layer.

Preferably, a projection of the power wire layer on the substrate at least partially overlaps with projections of a gate layer, a source layer and a drain layer on the substrate.

Preferably, the projections of the gate layer, the source layer and the drain layer on the substrate cover the projection of the power wire layer on the substrate.

Preferably, the power wire layer is made of copper or a copper alloy.

Preferably, the manufacturing method comprises steps of:

providing the substrate, and forming a pattern of the power wire layer on the substrate;

forming a first insulating layer on the substrate with the power wire layer formed thereon, and forming a via hole in the first insulating layer, so as to expose the power wire layer through the via hole;

forming a pattern of a gate layer on the substrate with the first insulating layer formed thereon;

forming a second insulating layer on the substrate with the gate layer formed thereon, and forming a via hole in the second insulating layer, so as to expose the power wire layer through the via hole in the first insulating layer and the via hole in the second insulating layer;

forming an active layer on the substrate with the second insulating layer formed thereon; and forming patterns of a source layer and a drain layer on the substrate with the active layer formed thereon such that the source layer is connected to the power wire layer via the via holes.

Alternatively, the manufacturing method comprises steps of:

providing the substrate, and forming a pattern of a gate layer on the substrate;

forming a first insulating layer on the substrate with the gate layer formed thereon;

forming an active layer on the substrate with the first insulating layer formed thereon;

forming patterns of a source layer and a drain layer on the substrate with the active layer formed thereon;

forming a second insulating layer on the substrate with the source layer and the drain layer formed thereon, and forming a via hole in the second insulating layer, so as to expose the source layer through the via hole; and forming the power wire layer on the substrate with the second insulating layer formed thereon such that the power wire layer is connected to the source layer via the via hole.

In the array substrate provided by the present invention and the array substrate manufactured by using the manufacturing method provided by the present invention, the power wire layer of the backplane power line is separately arranged in the array substrate as a layer. Compared to the power line, which is arranged in the same layer as and parallel to the gate layer or source/drain layer, in the prior art, the area of the projection of the power wire layer on the substrate may be larger, that is, the conductive cross-sectional area of the power wire layer may be larger, and thus the resistance of the power wire layer is decreased. Therefore, difference among currents of different pixel units is reduced, and thus the mura phenomenon generated in displaying is alleviated.

Further, the power wire layer is arranged as a layer separately, and may partially overlap with the gate layer or the source and drain layers in a vertical direction, which reduces the area, which is additionally occupied by the power wire layer, on the pixel unit, and facilitates increasing aperture ratio of the pixel.

In addition, the power wire layer is arranged in a lattice-like structure throughout the entire pixel area, that is to say, the power wire layers of adjacent pixel units are interconnected to form a lattice-like structure, which can further decrease the overall resistance of the power wire layer, reduce the difference among currents of different pixel units, and further alleviate the mura phenomenon generated in displaying.

DETAILED DESCRIPTION OF THE EMBODIMENTS

To enable those skilled in the art to better understand the technical solutions of the present invention, the present invention will be further described in detail below in conjunction with the accompanying drawings and the specific implementations.

Embodiment 1

This embodiment provides an array substrate and a manufacturing method thereof. The description is given by taking a bottom gate type array substrate as an example, but it should be understood that the present invention is also applicable to a top gate type array substrate.

Figure 2A:
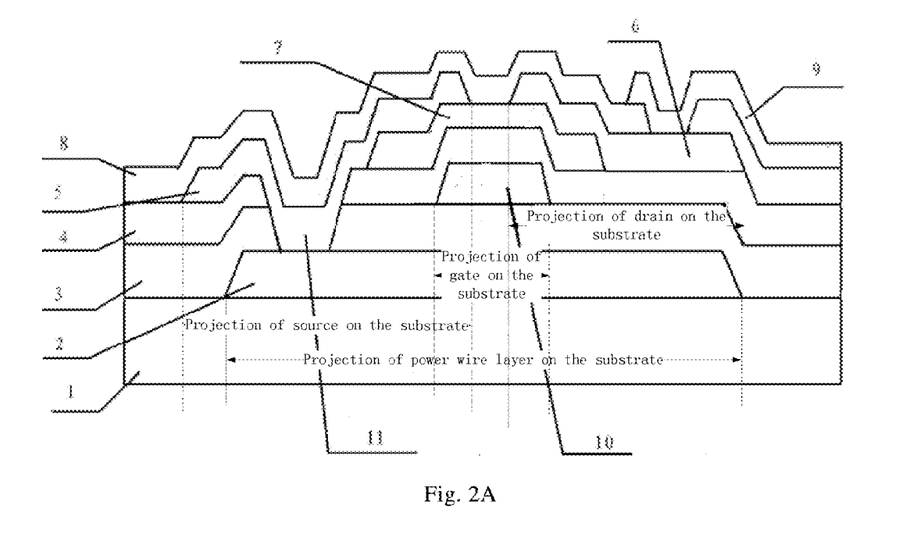
FIG. 2 is a cross-sectional diagram of an array substrate provide by Embodiment 1 of the present invention.
Figure 2B:
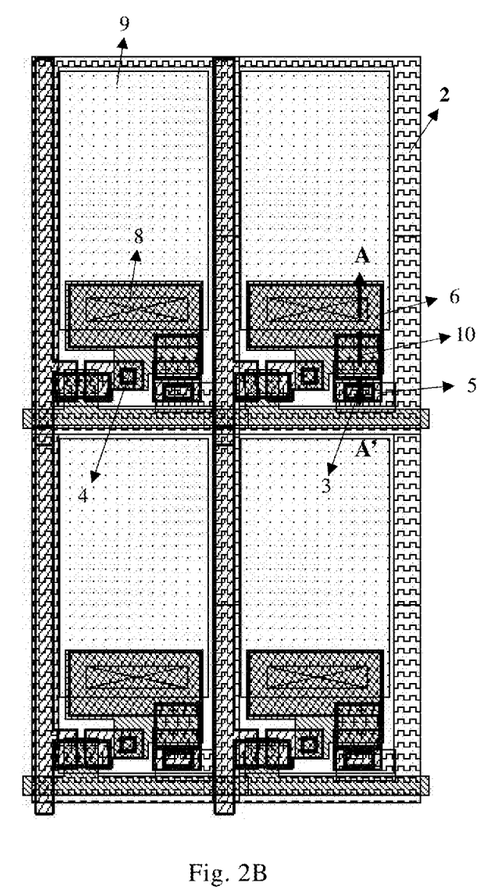

As shown in FIG. 2, the array substrate comprises a substrate 1 and a plurality of pixel units arranged in an array, each pixel unit comprises: an active layer 7, a source layer 5 and a drain layer 6 and a gate layer 10, and each pixel unit further comprises a power wire layer 2, which is connected to the source layer 5 via a via hole 11.

It should be noted that, the above substrate 1, the active layer 7, the source layer 5, the drain layer 6 and the gate layer 10 may be set by referring to those in the array substrate in the prior art, and therefore are not repeated herein.

The power wire layer 2 in the present embodiment is separately arranged, compared to the power line, which is arranged in the same layer as and parallel to the gate layer or source/drain layer, in the prior art, the power wire layer 2 in the present embodiment may have a projection with a larger area on the substrate 1, that is, the conductive cross-sectional area of the power wire layer 2 may be larger, and thus the resistance of the power wire layer 2 is decreased. Therefore, difference among currents of different pixel units is reduced, and thus the mura phenomenon generated in displaying is alleviated.

Preferably, a projection of the power wire layer 2 on the substrate 1 at least partially overlaps with projections of the gate layer 10, the source layer 5 and the drain layer 6 on the substrate 1. In this way, the area that is additionally occupied by the power wire layer on the pixel unit can be decreased, which facilitates increasing aperture ratio of the pixel.

Preferably, the projections of the gate layer 10, the source layer 5 and the drain layer 6 on the substrate 1 cover the projection of the power wire layer 2 on the substrate 1. In this way, the power wire layer 2 will not additionally occupy an area on the pixel unit, and is thus prevented from affecting the aperture ratio. Preferably, the power wire layer 2 is arranged in a lattice-like structure throughout an entire pixel area, that is to say, the power wire layers 2 of adjacent pixel units are interconnected to form a lattice-like structure, which can further decrease the overall resistance of the power wire layers 2 so as to reduce the difference among currents of different pixel units, and thus further alleviate the mura phenomenon generated in displaying.

Specifically, as shown in FIG. 2, the power wire layer 2 is arranged on the substrate 1, a first insulating layer 3 is provided on the power wire layer 2, the gate layer 10 is arranged on the first insulating layer 3, a second insulating layer 4 is provided on the gate layer 10, the active layer 7 is arranged on the second insulating layer 4, and the source layer 5 and the drain layer 6 which are in the same layer and spaced apart from each other are provided on the active layer 7; the source layer 5 is connected to the power wire layer 2 via the via holes 11 in the first insulating layer 3 and the second insulating layer 4, and therefore the supply voltage is delivered to the source layer 5 via the power wire layer 2.

In the present embodiment, the projections of the gate layer 10, the source layer 5 and the drain layer 6 on the substrate 1 cover and are larger than the projection of the power wire layer 2 on the substrate 1, but the present invention is not limited thereto. In order to further decrease the resistance of the power wire layer 2, the area of the projection of the power wire layer 2 on the substrate 1 may be increased, for example, the projection of the power wire layer 2 on the substrate 1 may completely overlap with the projections of the gate layer 10, the source layer 5 and the drain layer 6 on the substrate 1. In this way, the resistance of the power wire layer 2 can be decreased without affecting aperture ratio of the pixel.

Optionally, a third insulating layer 8 may be provided on the source layer 5, and a pixel electrode layer 9 may be provided on the third insulating layer 8, and the pixel electrode layer 9 is connected to the drain layer 6. When the gate layer 10 receives a gate line voltage Vgate, the supply voltage VDD is delivered to the pixel electrode layer 9 through the source layer 5 and the drain layer 6, so as to drive an OLED (not shown in FIG. 2) to emit light.

The present embodiment further provides a manufacturing method of the above array substrate.

As shown in FIGS. 3 to 8, the manufacturing method of the above array substrate includes steps a to f.

Figure 3:
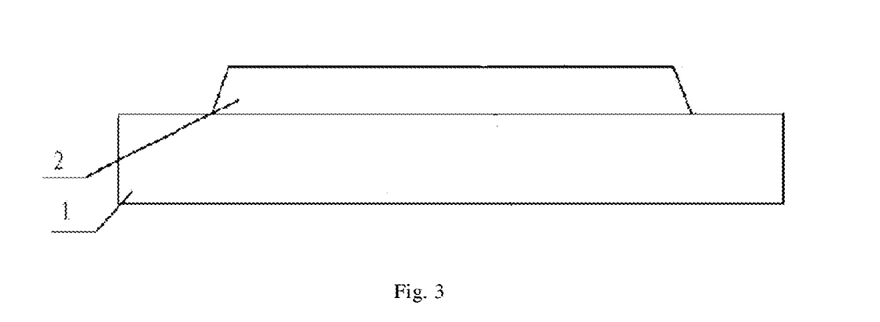
FIGS. 3 to 8 schematically illustrate processes of a manufacturing method of an array substrate provide by Embodiment 1 of the present invention.

At step a, as shown in FIG. 3, a substrate is provided, and a pattern of a power wire layer 2 is formed on the substrate.

At first, the pattern of the power wire layer 2 formed by a conductive metal layer is formed on the substrate 1 through one patterning process. The substrate 1 may be an elastic-plastic substrate.

Specifically, a conductive metal layer may be deposited on the substrate 1 by means of sputtering or thermal evaporation. Preferably, material of the conductive metal layer is copper or a copper alloy, and in this way, the resistance of the power wire layer 2 can be further lowered.

It should be understood that, the material of the conductive metal layer may be any one of Cr, W, Ta, Mo, Al and the like and an alloy thereof, and in addition, the conductive metal layer may be formed by a plurality of metal films. A layer of photoresist is coated on the conductive metal layer, and the photoresist is exposed by using a mask plate so that the photoresist forms a non-photoresist-remaining area and a photoresist-remaining area, wherein the photoresist-remaining area corresponds to an area where the pattern of the power wire layer 2 is to be formed and the non-photoresist-remaining area corresponds to the area other than said pattern; a developing process is performed, so that the photoresist in the non-photoresist-remaining area is removed completely and thickness of the photoresist in the photoresist-remaining area remains unchanged; the conductive metal layer in the non-photoresist-remaining area is completely etched off through an etching process, thus forming the pattern of the power wire layer 2; and the remaining photoresist is stripped off.

Figure 4:
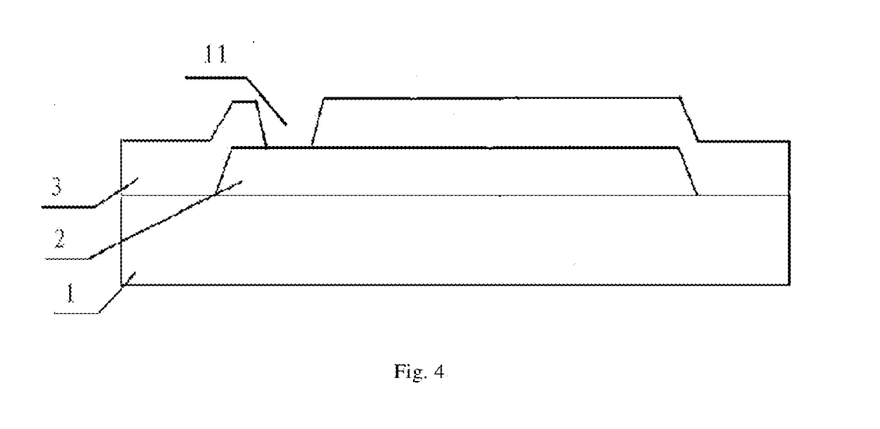

At step b, as shown in FIG. 4, a first insulating layer 3 is formed on the substrate 1 with the source wire layer 2 formed thereon.

Specifically, a layer of material for insulating layer may be deposited on the substrate 1 subjected to step a by using a plasma enhanced chemical vapor deposition (PECVD) method, so as to form the first insulating layer 3. The material for insulating layer may be an oxide, a nitride or an oxynitride. The first insulating layer may be of a structure having a single layer, double layers or multiple layers.

It can be understood that, step b further includes: forming a via hole in the formed first insulating layer 3.

Specifically, a photoresist is coated on the first insulating layer 3, and is exposed by using a mask plate, so that the photoresist forms a non-photoresist-remaining area corresponding to an area where the via hole 11 is to be formed and a photoresist-remaining area; then a developing process is performed, so that the photoresist in the non-photoresist-remaining area is removed completely and thickness of the photoresist in the photoresist-remaining area remains unchanged; the material for insulating layer in the non-photoresist-remaining area is completely etched off through an etching process, so as to form the via hole, and at this point, the power wire layer 2 is exposed through the via hole; and the remaining photoresist is stripped off.

Figure 5:
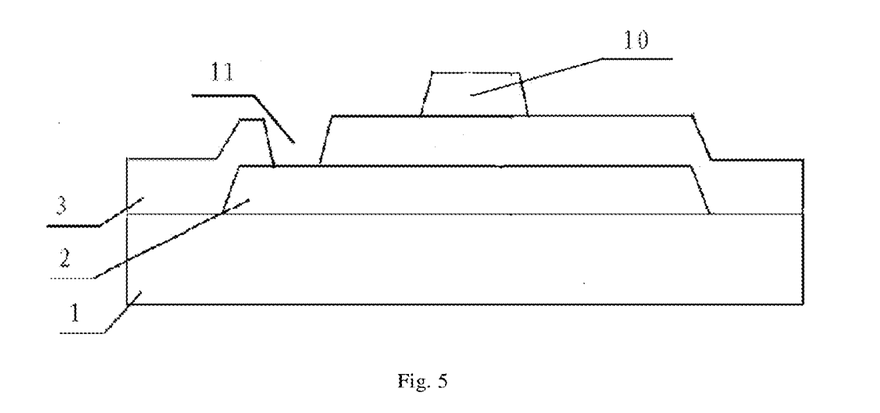

At step c, as shown in FIG. 5, a pattern of a gate layer 10 formed by a gate metal layer is formed on the substrate 1 with the power wire layer 2 and the first insulating layer 3 formed thereon.

Specifically, a gate metal layer may be deposited on the substrate 1 subjected to step b by means of sputtering or thermal evaporation. Material of the gate metal layer may be any one of Cr, W, Ta, Mo, Al, Cu and the like or an alloy thereof, and in addition, the gate metal layer may be formed by a plurality of metal films. A layer of photoresist is coated on the gate metal layer, and the photoresist is exposed by using a mask plate so that the photoresist forms a non-photoresist-remaining area and a photoresist-remaining area, wherein the photoresist-remaining area corresponds to an area where the pattern of the gate layer 10 is to be formed, and the non-photoresist-remaining area corresponds to the area (including the area corresponding to the via hole 11) other than said area where the pattern of the gate layer 10 is to be formed; a developing process is performed, so that the photoresist in the non-photoresist-remaining area is removed completely and thickness of the photoresist in the photoresist-remaining area remains unchanged; the gate metal layer in the non-photoresist-remaining area is completely etched off through an etching process, so as to form the pattern of the gate layer 10; and the remaining photoresist is stripped off.

Figure 6:
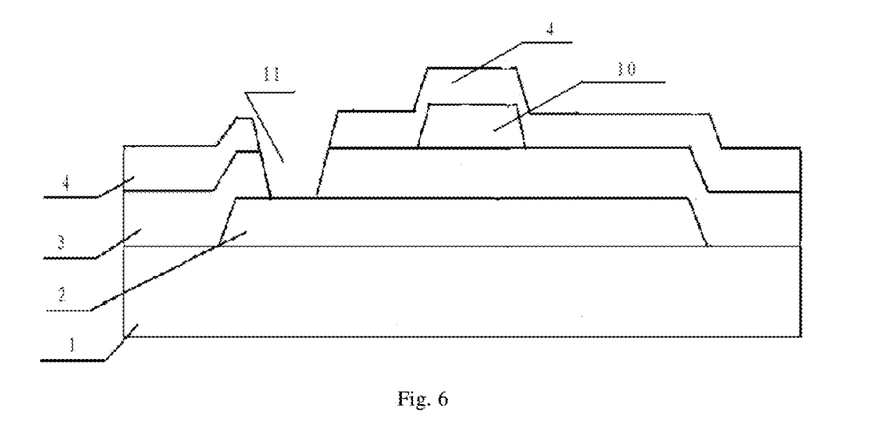

At step d, as shown in FIG. 6, a second insulating layer 4 is formed on the substrate 1 with the gate layer 10 formed thereon.

Specifically, a layer of insulating material may be deposited on the substrate 1 subjected to step c by using a plasma enhanced chemical vapor deposition (PECVD) method, so as to form the second insulating layer 4. The insulating material may be an oxide, a nitride or an oxynitride, and the second insulating layer 4 may be of a structure having a single layer, double layers or multiple layers.

It can be understood that, step d further includes: forming a via hole in the formed second insulating layer 4.

Specifically, a photoresist is coated on the second insulating layer 4, and is exposed by using a mask plate, so that the photoresist forms a non-photoresist-remaining area corresponding to an area where the via hole 11 is to be formed and a photoresist-remaining area; then a developing process is performed, so that the photoresist in the non-photoresist-remaining area is removed completely and thickness of the photoresist in the photoresist-remaining area remains unchanged; the insulating material in the non-photoresist-remaining area is completely etched off through an etching process, so as to form the via hole; at this point, the via hole formed in the first insulating layer 3 and the via hole formed in the second insulating layer 4 form the via hole 11 together, and the power wire layer 2 is exposed through the via hole 11; and the remaining photoresist is stripped off.

Figure 7:
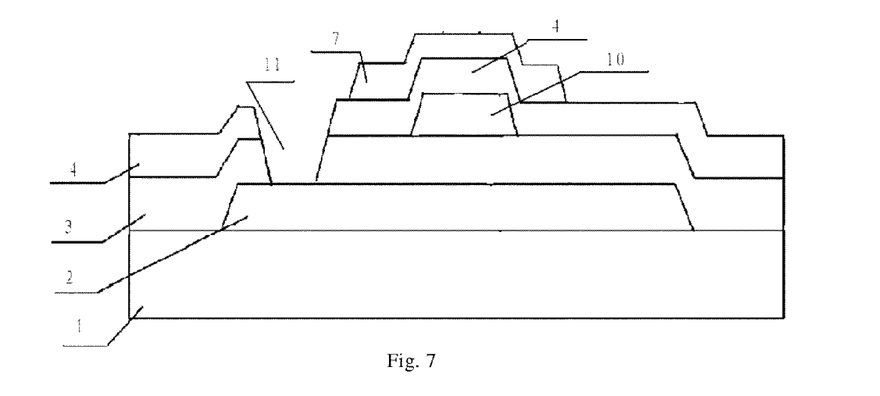

At step e, as shown in FIG. 7, an active layer 7 is formed on the substrate 1 with the second insulating layer 4 formed thereon.

Specifically, a layer of metal oxide semiconductor such as indium gallium zinc oxide (IGZO) may be first deposited, as the active layer 7, on the substrate 1 subjected to step d by way of magnetron sputtering, thermal evaporation or other film forming technique, and the metal oxide semiconductor may have a thickness in the range of 10 nm to 50 nm.

Next, a photoresist is coated on the active layer 7, and is exposed by using a mask plate so that the photoresist forms a non-photoresist-remaining area comprising an area corresponding to the via hole 11 and a photoresist-remaining area corresponding to an area where the pattern of the active layer 7 is to be formed; a developing process is performed, so that the photoresist in the non-photoresist-remaining area is removed completely and thickness of the photoresist in the photoresist-remaining area remains unchanged; the metal oxide semiconductor in the non-photoresist-remaining area is completely etched off through an etching process, thus forming the pattern of the active layer 7; and the remaining photoresist is stripped off.

Figure 8:
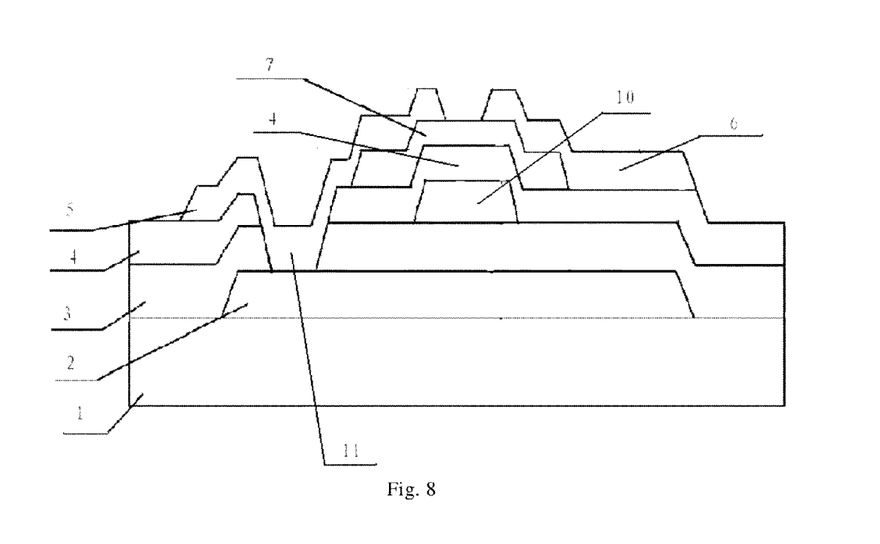

At step f, as shown in FIG. 8, patterns of a source layer 5 and a drain layer 6 are formed on the substrate 1 with the active layer 7 formed thereon.

Specifically, a source/drain metal layer is deposited on the substrate 1 subjected to step e by way of magnetron sputtering, thermal evaporation or other film forming technique. Material of the source/drain metal layer may be any one of Cr, W, Ta, Mo, Al, Cu and the like or an alloy thereof, and the source/drain metal layer may be formed by a plurality of metal films. A layer of photoresist is coated on the source/drain metal layer, and the photoresist is exposed by using a mask plate so that the photoresist forms a non-photoresist-remaining area and a photoresist-remaining area, wherein the photoresist-remaining area corresponds to areas where the patterns of the source layer 5 and the drain layer 6 are to be formed and an area where the via hole 11 is located, and the non-photoresist-remaining area corresponds to the area other than the foregoing areas; a developing process is performed, so that the photoresist in the non-photoresist-remaining area is removed completely and thickness of the photoresist in the photoresist-remaining area remains unchanged; the source/drain metal layer in the non-photoresist-remaining area is completely etched off through an etching process, so as to form the patterns of the source layer 5 and the drain layer 6, and at this point, the formed source layer 5 is connected to the power wire layer 2 through the via holes 11 in the first and second insulation layers; and the remaining photoresist is stripped off.

It should be understood that, a first insulating layer 8, a pixel electrode 9 and the like may be further formed by using known patterning processes, which is not elaborated herein, and the array substrate shown in FIG. 2 is finally formed.

Embodiment 2

Figure 9:
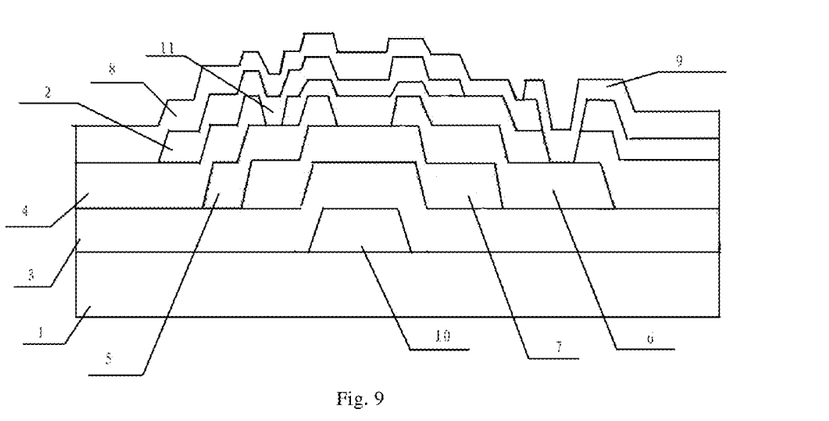
FIG. 9 is a cross-sectional diagram of an array substrate provide by Embodiment 2 of the present invention.
Figure 10:
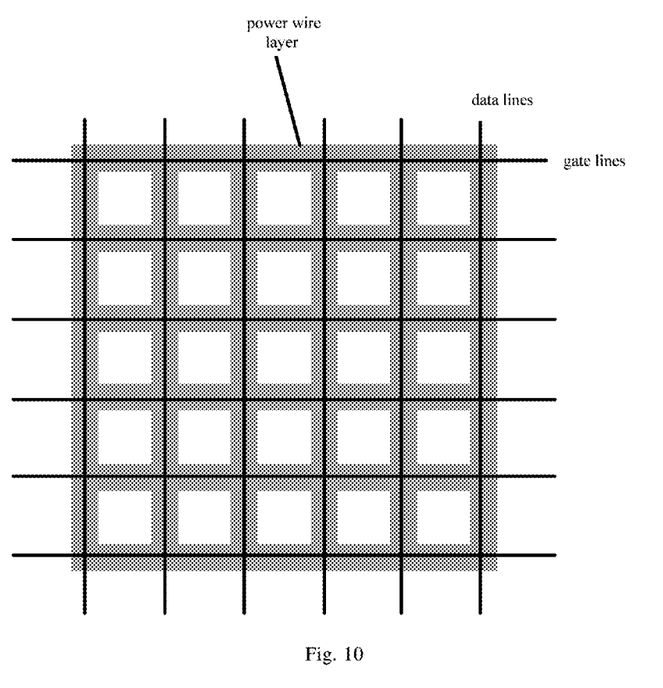
FIG. 10 is a plan view depicting a power wire layer of the Embodiments arranged in a lattice-like structure.

This embodiment provides an array substrate, whose structure differs from that of the array substrate in Embodiment 1 in that the power wire layer 2 is provided above the source layer 5 and the drain layer 6 and the source layer 5 is connected to the power wire layer 2 through the via hole 11 in the second insulating layer 4 between the source layer 5 and the power wire layer 2, and the other layers are adjusted accordingly.

Specifically, as shown in FIG. 9, a gate layer 10 is provided on a substrate 1, a first insulating layer 3 is provided on the gate layer 10, an active layer 7 is provided on the first insulating layer 3, and a source layer 5 and a drain layer 6 which are in the same layer and spaced apart from each other are provided on the active layer 7; a second insulating layer 4 is provided on the source layer 5 and the drain layer 6, a power wire layer 2 is provided on the second insulating layer 4, and the power wire layer 2 is connected to the source layer 5 via the via hole 11 in the second insulating layer 4.

Since the source layer 5 is connected to the power line layer 2 through the via hole 11 in the second insulating layer

4, the supply voltage is delivered to the source layer 5 through the power line layer 2.

In the present embodiment, projections of the gate layer 10, the source layer 5 and the drain layer 6 on the substrate 1 partially overlap with the projection of the power wire layer 2 on the substrate 1, but the present invention is not limited thereto. For example, in order to reduce influence on aperture ratio of a pixel, the area of the projection of the power wire layer 2 on the substrate 1 may be decreased such that the projection of the power wire layer 2 on the substrate 1 may be completely covered by the projections of the gate layer 10, the source layer 5 and the drain layer 6 on the substrate 1. In this way, although the resistance of the power wire layer 2 will be increased, the power wire layer 2 can be prevented from affecting aperture ratio of the pixel. In actual applications, the area of the projection of the power wire layer 2 on the substrate 1 may be set according to various requirements on the resistance and aperture ratio.

Optionally, a third insulating layer 8 may be provided on the power wire layer 2, and a pixel electrode layer 9 connected to the drain layer 6 may be provided on the third insulating layer 8. When the gate layer 10 receives a gate voltage Vgate, the supply voltage VDD is delivered to the pixel electrode layer 9 through the source layer 5 and the drain layer 6, so as to drive an OLED (not shown in FIG. 9) to emit light.

The present embodiment further provides a manufacturing method of the above array substrate, and the manufacturing method of the array substrate comprises steps of:

providing a substrate, and forming a pattern of a gate layer on the substrate;

forming a first insulating layer on the substrate with the gate layer formed thereon;

forming an active layer on the substrate with the first insulating layer formed thereon;

forming patterns of a source layer and a drain layer on the substrate with the active layer formed thereon;

forming a second insulating layer on the substrate with the source layer and the drain layer formed thereon, and forming a via hole in the second insulating layer, so as to expose the source layer through the via hole; and forming a power wire layer on the substrate with the second insulating layer formed thereon.

The specific implementations of the above steps are similar to those of the steps in the manufacturing method of the array substrate in Embodiment 1, and are thus not repeated herein.

It can be understood that, the above implementations are merely exemplary implementations for explaining the principle of the present invention, but the present invention is not limited thereto. A technical solutions in which the above power wire layer may be arranged between any two layers, as long as the power wire layer is separately arranged and connected to the source layer falls into the protection scope of the present invention. For those skilled in the art, various variations and improvements may be made without departing from the spirit and essence of the present invention, and these variations and improvements are also deemed as the protection scope of the present invention.

The invention claimed is:

1. An array substrate, comprising a substrate; and a plurality of pixel units arranged in an array, each of the pixel units in the plurality of pixel units comprising: an active layer, a source layer and a drain layer arranged in a same layer, and a gate layer, wherein the array substrate further comprises a power wire layer, which is connected to the source layer via a via hole; and in each of the pixel units in the plurality of pixel units, projections of the gate layer, the source layer and the drain layer on the substrate completely cover projection of the power wire layer on the substrate in a cross-sectional view.

2. The array substrate according to claim 1, wherein, in each of the pixel units in the plurality of pixel units, the projections of the gate layer, the source layer and the drain layer on the substrate completely overlap the projection of the power wire layer on the substrate in the cross-sectional view.

3. The array substrate according to claim 1, wherein, a part of the power wire layer out of the cross-sectional view is arranged in a lattice-like structure throughout an entire pixel area.

4. The array substrate according to claim 1, wherein, the power wire layer is made of copper or a copper alloy.

5. The array substrate according to claim 1, wherein, the power wire layer is arranged on the substrate, a first insulating layer is provided on the power wire layer, the gate layer is arranged on the first insulating layer, a second insulating layer is provided on the gate layer, the active layer is arranged on the second insulating layer, the source layer and the drain layer are arranged on the active layer in a same layer and spaced apart from each other, the source layer is connected to the power wire layer via the via hole in both the first insulating layer and the second insulating layer.

6. The array substrate according to claim 1, wherein, the gate layer is arranged on the substrate, a first insulating layer is provided on the gate layer, the active layer is arranged on the first insulating layer, and the source layer and the drain layer are arranged on the active layer in a same layer and spaced apart from each other; a second insulating layer is provided on the source layer and the drain layer, the power wire layer is arranged on the second insulating layer, and the power wire layer is connected to the source layer via the via hole in the second insulating layer.

7. The array substrate according to claim 3, wherein, the power wire layer is arranged on the substrate, a first insulating layer is provided on the power wire layer, the gate layer is arranged on the first insulating layer, a second insulating layer is provided on the gate layer, the active layer is arranged on the second insulating layer, the source layer and the drain layer are arranged on the active layer in a same layer and spaced apart from each other, the source layer is connected to the power wire layer via the via hole in both the first insulating layer and the second insulating layer.

8. The array substrate according to claim 3, wherein, the gate layer is arranged on the substrate, a first insulating layer is provided on the gate layer, the active layer is arranged on the first insulating layer, and the source layer and the drain layer are arranged on the active layer in a same layer and spaced apart from each other; a second insulating layer is provided on the source layer and the drain layer, the power wire layer is arranged on the second insulating layer, and the power wire layer is connected to the source layer via the via hole in the second insulating layer.

* * * * *